United States Patent
Ching et al.

(10) Patent No.: US 10,468,528 B2
(45) Date of Patent: Nov. 5, 2019

(54) FINFET DEVICE WITH HIGH-K METAL GATE STACK

(71) Applicant: Taiwan Semiconductor Manufacturing Company, Ltd., Hsin-Chu (TW)

(72) Inventors: Kuo-Cheng Ching, Hsinchu County (TW); Ka-Hing Fung, Hsinchu County (TW); Chih-Sheng Chang, Hsinchu (TW); Zhiqiang Wu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/254,035

(22) Filed: Apr. 16, 2014

(65) Prior Publication Data

US 2015/0303305 A1 Oct. 22, 2015

(51) Int. Cl.
*H01L 29/78* (2006.01)
*H01L 29/16* (2006.01)
(Continued)

(52) U.S. Cl.
CPC .... *H01L 29/7851* (2013.01); *H01L 21/02236* (2013.01); *H01L 21/02255* (2013.01);
(Continued)

(58) Field of Classification Search
CPC ............. H01L 29/66795; H01L 29/785; H01L 29/165; H01L 29/66545; H01L 29/7849
See application file for complete search history.

(56) References Cited

U.S. PATENT DOCUMENTS

| 6,359,311 B1 | 3/2002 | Colinge et al. |
| 6,475,869 B1 | 11/2002 | Yu et al. |
| (Continued) | | |

FOREIGN PATENT DOCUMENTS

| CN | 103928517 | 7/2014 |
| CN | 103928518 | 7/2014 |

OTHER PUBLICATIONS

U.S. Appl. No. 14/254,072, filed Apr. 16, 2014, by inventors Kuo-Cheng Ching, Ka-Hing Fung, Chih-Sheng Chang and Zhiqiang Wu for "A Method and Structure for FinFET Device," 26 pages of text, 14 pages of drawings.
(Continued)

*Primary Examiner* — Samuel A Gebremariam
*Assistant Examiner* — Jonas T Beardsley
(74) *Attorney, Agent, or Firm* — Haynes and Boone, LLP

(57) ABSTRACT

The present disclosure provides a semiconductor device that includes a substrate, a first fin structure over the substrate. The first fin structure includes a first semiconductor material layer, having a semiconductor oxide layer as its outer layer, as a lower portion of the first fin structure. The first semiconductor has a first width. The first fin structure also includes a second semiconductor material layer as an upper portion of the first fin structure. The second semiconductor material layer has a third width, which is substantially smaller than the first width. The semiconductor structure also includes a gate region formed over a portion of the first fin and a high-k (HK)/metal gate (MG) stack on the substrate including wrapping over a portion of the first fin structure in the gate region.

20 Claims, 14 Drawing Sheets

(51) Int. Cl.
*H01L 29/161* (2006.01)
*H01L 29/165* (2006.01)
*H01L 29/06* (2006.01)
*H01L 29/66* (2006.01)
*H01L 29/49* (2006.01)
*H01L 29/51* (2006.01)
*H01L 21/762* (2006.01)
*H01L 21/02* (2006.01)

(52) U.S. Cl.
CPC .... *H01L 21/76224* (2013.01); *H01L 29/0653* (2013.01); *H01L 29/16* (2013.01); *H01L 29/161* (2013.01); *H01L 29/165* (2013.01); *H01L 29/495* (2013.01); *H01L 29/4966* (2013.01); *H01L 29/517* (2013.01); *H01L 29/6681* (2013.01); *H01L 29/0673* (2013.01)

(56) References Cited

U.S. PATENT DOCUMENTS

| | | | |
|---|---|---|---|
| 7,074,662 | B2 | 7/2006 | Lee et al. |
| 7,078,299 | B2 | 7/2006 | Maszara et al. |
| 7,741,182 | B2 | 6/2010 | Van Noort et al. |
| 7,855,105 | B1 | 12/2010 | Jagannathan et al. |
| 7,939,406 | B2 | 5/2011 | Grisham et al. |
| 8,455,307 | B2 | 6/2013 | Cho |
| 8,716,074 | B2 | 5/2014 | Masazara et al. |
| 8,759,943 | B2 | 6/2014 | Tseng et al. |
| 8,815,670 | B2 | 8/2014 | Basker et al. |
| 8,883,570 | B2 | 11/2014 | Lu |
| 8,901,607 | B2 | 12/2014 | Wang et al. |
| 8,932,927 | B2* | 1/2015 | Zhou ............... H01L 29/66477 438/151 |
| 8,987,790 | B2 | 3/2015 | Cheng et al. |
| 9,006,786 | B2 | 4/2015 | Ching et al. |
| 9,209,185 | B2 | 12/2015 | Ching et al. |
| 9,257,559 | B2 | 2/2016 | Ching et al. |
| 9,318,606 | B2 | 4/2016 | Wang et al. |
| 2002/0109182 | A1 | 8/2002 | Lee et al. |
| 2005/0104096 | A1 | 5/2005 | Lee et al. |
| 2005/0112851 | A1 | 5/2005 | Lee et al. |
| 2005/0184316 | A1 | 8/2005 | Kim et al. |
| 2005/0242376 | A1 | 11/2005 | Chen et al. |
| 2005/0272192 | A1 | 12/2005 | Oh et al. |
| 2006/0044915 | A1 | 3/2006 | Park et al. |
| 2006/0076625 | A1 | 4/2006 | Lee et al. |
| 2006/0118876 | A1 | 6/2006 | Lee et al. |
| 2006/0177998 | A1 | 8/2006 | Lin et al. |
| 2007/0057325 | A1 | 3/2007 | Hsu et al. |
| 2007/0120154 | A1* | 5/2007 | Zhu ............... H01L 29/42384 257/288 |
| 2008/0079094 | A1 | 4/2008 | Jin et al. |
| 2008/0119020 | A1 | 5/2008 | Grisham et al. |
| 2009/0008705 | A1* | 1/2009 | Zhu ............... H01L 29/66795 257/327 |
| 2009/0095980 | A1 | 4/2009 | Yu et al. |
| 2009/0130826 | A1* | 5/2009 | Kim ............... H01L 21/02381 438/478 |
| 2010/0163842 | A1 | 7/2010 | Lai et al. |
| 2010/0163971 | A1 | 7/2010 | Hung et al. |
| 2010/0207201 | A1 | 8/2010 | Masuoka et al. |
| 2010/0264468 | A1 | 10/2010 | Xu |
| 2011/0049613 | A1 | 3/2011 | Yeh et al. |
| 2011/0073952 | A1 | 3/2011 | Kwok et al. |
| 2011/0081764 | A1 | 4/2011 | Maszara et al. |
| 2011/0108920 | A1 | 5/2011 | Basker et al. |
| 2011/0147711 | A1 | 6/2011 | Pillarisetty et al. |
| 2011/0147811 | A1* | 6/2011 | Kavalieros ........ H01L 29/66795 257/288 |
| 2011/0193141 | A1 | 8/2011 | Lin et al. |
| 2011/0193178 | A1* | 8/2011 | Chang ............... H01L 29/66795 257/408 |
| 2011/0193187 | A1* | 8/2011 | Nakamura ........... H01G 9/2027 257/431 |
| 2011/0233679 | A1 | 9/2011 | Chen et al. |
| 2012/0086053 | A1 | 4/2012 | Tseng et al. |
| 2012/0235224 | A1 | 9/2012 | Yeh et al. |
| 2012/0292672 | A1* | 11/2012 | Cho ................. H01L 21/823431 257/288 |
| 2013/0005114 | A1 | 1/2013 | Maszara et al. |
| 2013/0056795 | A1 | 3/2013 | Wu et al. |
| 2013/0102137 | A1 | 4/2013 | Jeng |
| 2013/0113042 | A1 | 5/2013 | Wang et al. |
| 2013/0119482 | A1 | 5/2013 | Wann et al. |
| 2013/0134516 | A1* | 5/2013 | Zhou ............... H01L 29/66477 257/347 |
| 2013/0175621 | A1 | 7/2013 | Chen et al. |
| 2013/0230953 | A1 | 9/2013 | Sudo et al. |
| 2013/0299875 | A1 | 11/2013 | Hang Zhongshan |
| 2014/0008734 | A1 | 1/2014 | Lu |
| 2014/0015015 | A1 | 1/2014 | Krivokapic et al. |
| 2014/0042526 | A1 | 2/2014 | Masuoka et al. |
| 2014/0175561 | A1 | 6/2014 | Colinge et al. |
| 2014/0197456 | A1* | 7/2014 | Wang et al. ................. 257/192 |
| 2014/0197457 | A1* | 7/2014 | Wang et al. ................. 257/192 |
| 2014/0197458 | A1 | 7/2014 | Ching et al. |
| 2014/0203333 | A1 | 7/2014 | Huang et al. |
| 2014/0203334 | A1 | 7/2014 | Colinge et al. |
| 2014/0217483 | A1 | 8/2014 | Choi et al. |
| 2014/0225219 | A1 | 8/2014 | Huang et al. |
| 2014/0252469 | A1 | 9/2014 | Lee et al. |
| 2014/0264483 | A1 | 9/2014 | Yoshida et al. |
| 2014/0264592 | A1 | 9/2014 | Oxland et al. |
| 2014/0264610 | A1 | 9/2014 | Yang et al. |
| 2014/0283599 | A1 | 9/2014 | Kim et al. |
| 2014/0299934 | A1 | 10/2014 | Kim et al. |
| 2014/0306297 | A1 | 10/2014 | Ching et al. |
| 2014/0312398 | A1 | 10/2014 | Ching et al. |
| 2014/0312432 | A1 | 10/2014 | Ching et al. |
| 2014/0353731 | A1* | 12/2014 | Colinge et al. ............ 257/288 |
| 2014/0374832 | A1 | 12/2014 | Kuoh et al. |
| 2015/0008483 | A1 | 1/2015 | Ching et al. |
| 2015/0008489 | A1 | 1/2015 | Ching et al. |
| 2015/0021695 | A1 | 1/2015 | Hu et al. |
| 2015/0021697 | A1 | 1/2015 | Colinge et al. |
| 2015/0028426 | A1 | 1/2015 | Ching et al. |
| 2015/0041911 | A1 | 2/2015 | Chan et al. |
| 2015/0060960 | A1 | 3/2015 | Xie et al. |
| 2015/0102424 | A1 | 4/2015 | Colinge |
| 2015/0137263 | A1* | 5/2015 | Lee ............... H01L 29/785 257/401 |
| 2015/0200300 | A1 | 7/2015 | Ching et al. |
| 2015/0303198 | A1 | 10/2015 | Ching et al. |

OTHER PUBLICATIONS

U.S. Appl. No. 13/934,992, filed Jul. 3, 2013, by inventors Kuo-Cheng Ching, Chih-Hao Wang, Zhiqiang Wu and Carlos H. Diaz for "Fin Structure of Semiconductor Device," 21 pages of text, 12 pages of drawings.

U.S. Appl. No. 13/740,373, filed Jan. 14, 2013, by inventors Chih-Hao Wang, Kuo-Cheng Ching, Gwan Sin Chang, and Zhiqiang Wu for "Semiconductor Device and Fabricating the Same," 21 pages of text, 17 pages of drawings.

U.S. Appl. No. 13/902,322, filed May 24, 2013, by inventors Chih-Hao Wang, Kuo-Cheng Ching, Gwan Sin Chang, and Zhiqiang Wu for "FinFET Device and Method of Fabricating Same," 20 pages of text, 15 pages of drawings.

U.S. Appl. No. 14/155,793, filed Jan. 15, 2014, by inventors Kuo-Cheng Ching, Chih-Hao Wang, Zhiqiang Wu and Carlos H. Diaz for "Semiconductor Device and Formation Thereof," 16 pages of text, 12 pages of drawings.

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008, pp. 054909-1 through 054909-5, American Institute of Physics.

F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.

(56) References Cited

OTHER PUBLICATIONS

Tetlin et al., "Kinetics and Mechanism of Low Temperature Atomic Oxygen-Assisted Oxidation of SiGe Layers," Journal of Applied Physics, Mar. 1, 1998, pp. 2842-2846, vol. 83, No. 5, American Institute of Physics.

P. Gas et al., "Diffusion of Sb, Ga, Ge, and (AS) in TiSi2," Journal of Applied Physics, Jun. 1, 1988, pp. 5335-5345, vol. 63, No. 11, American Institute of Physics.

\* cited by examiner

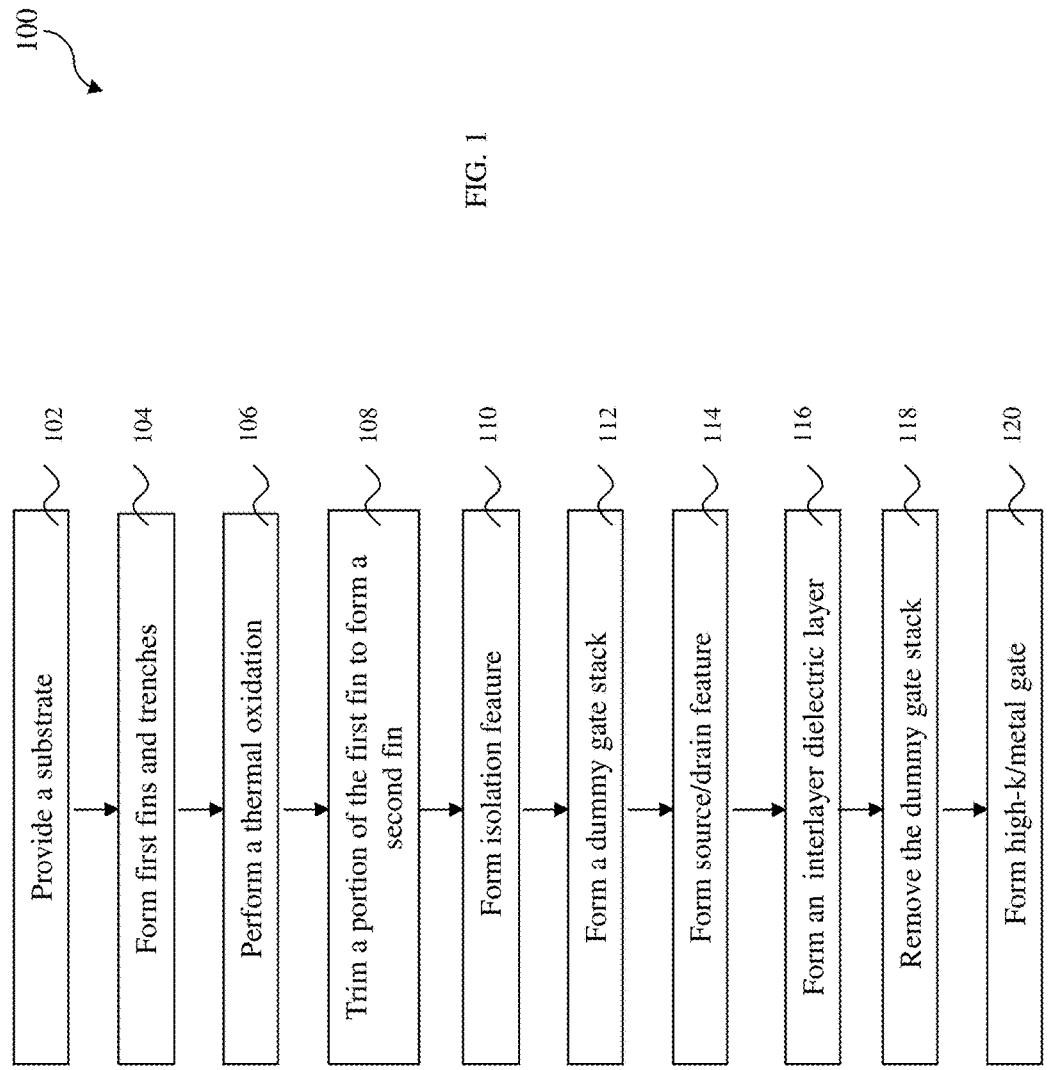

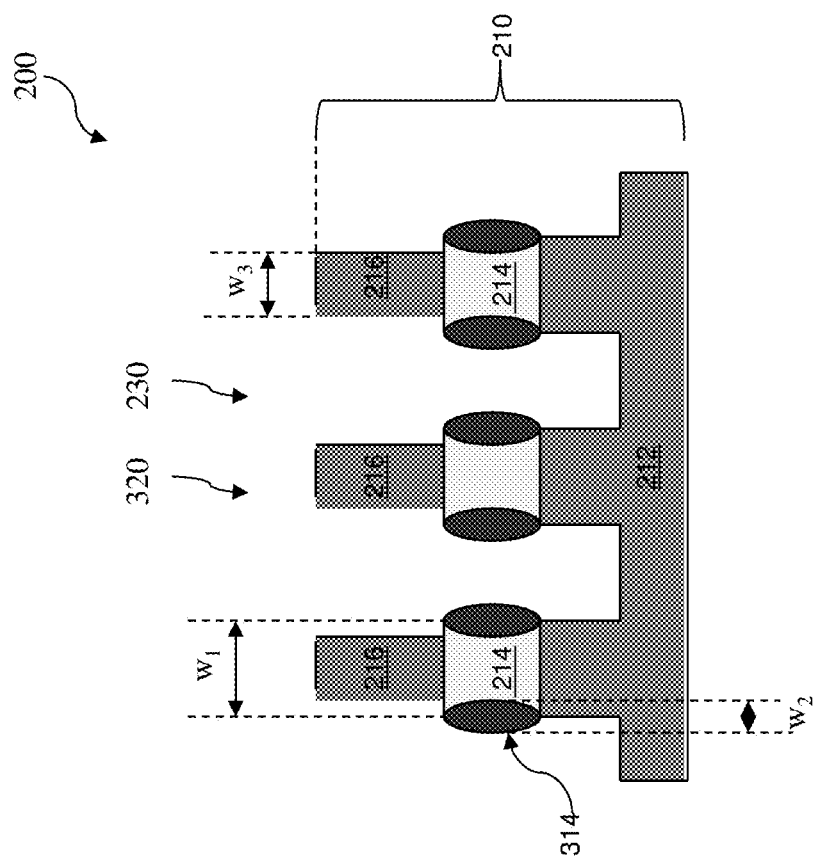

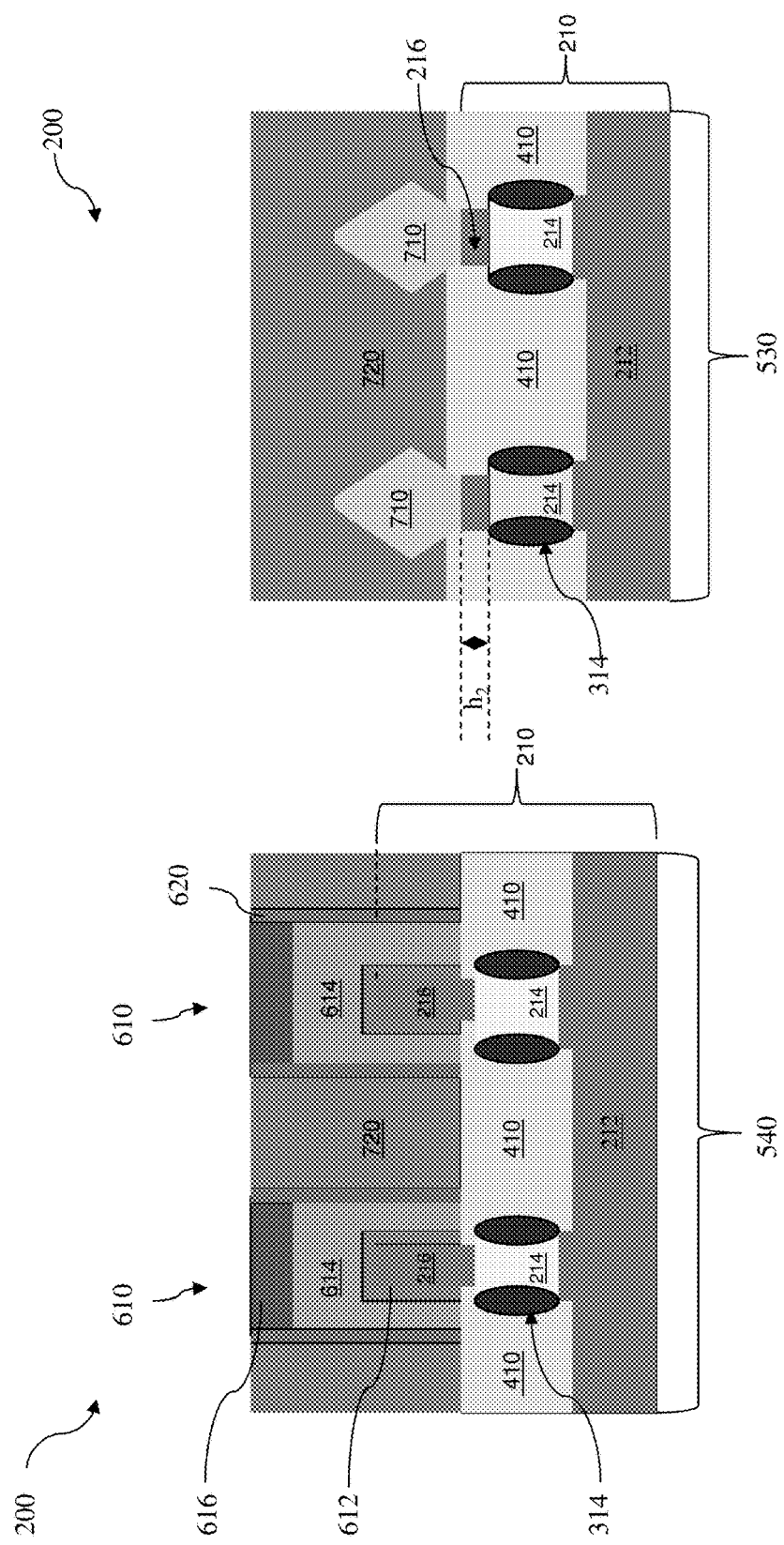

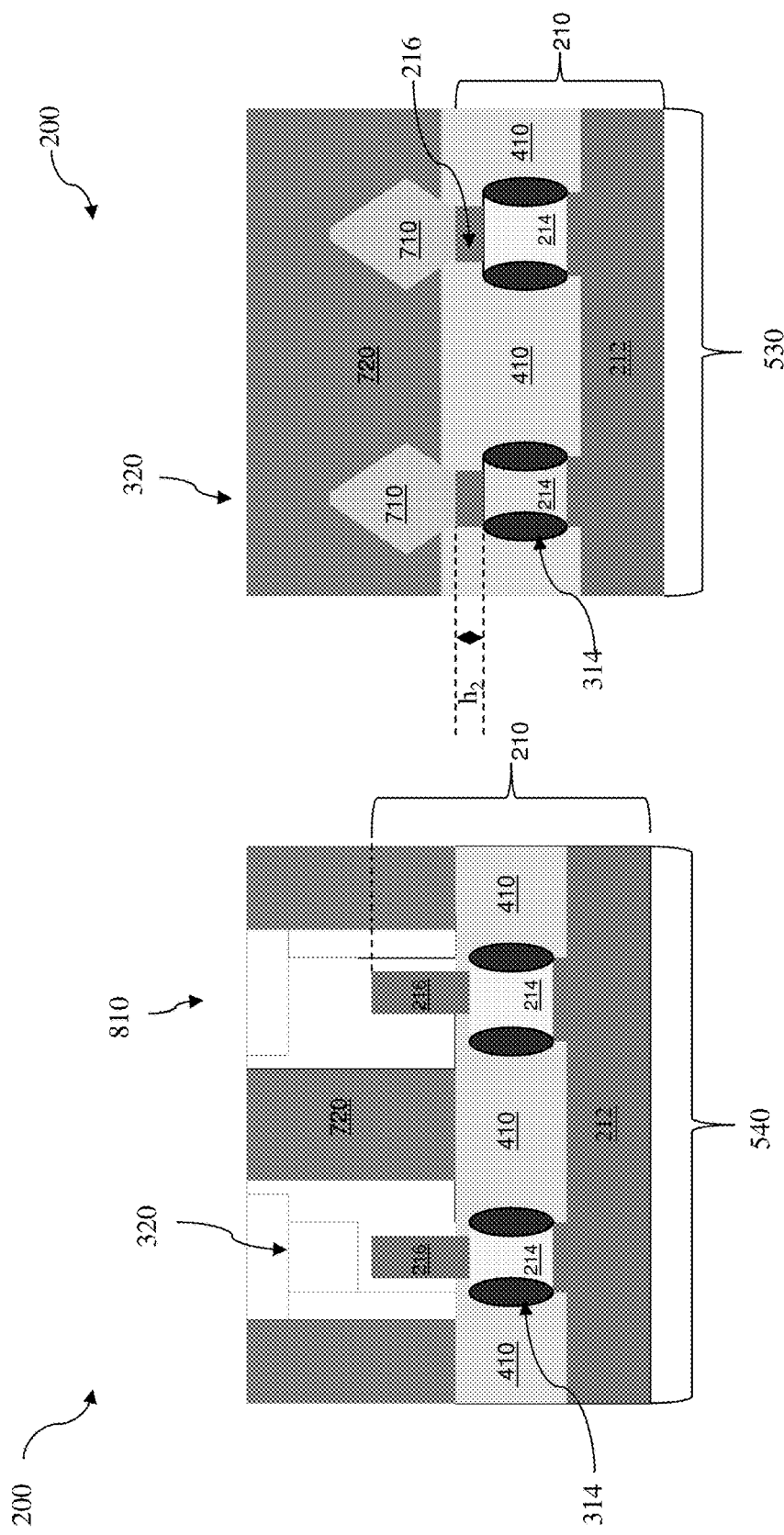

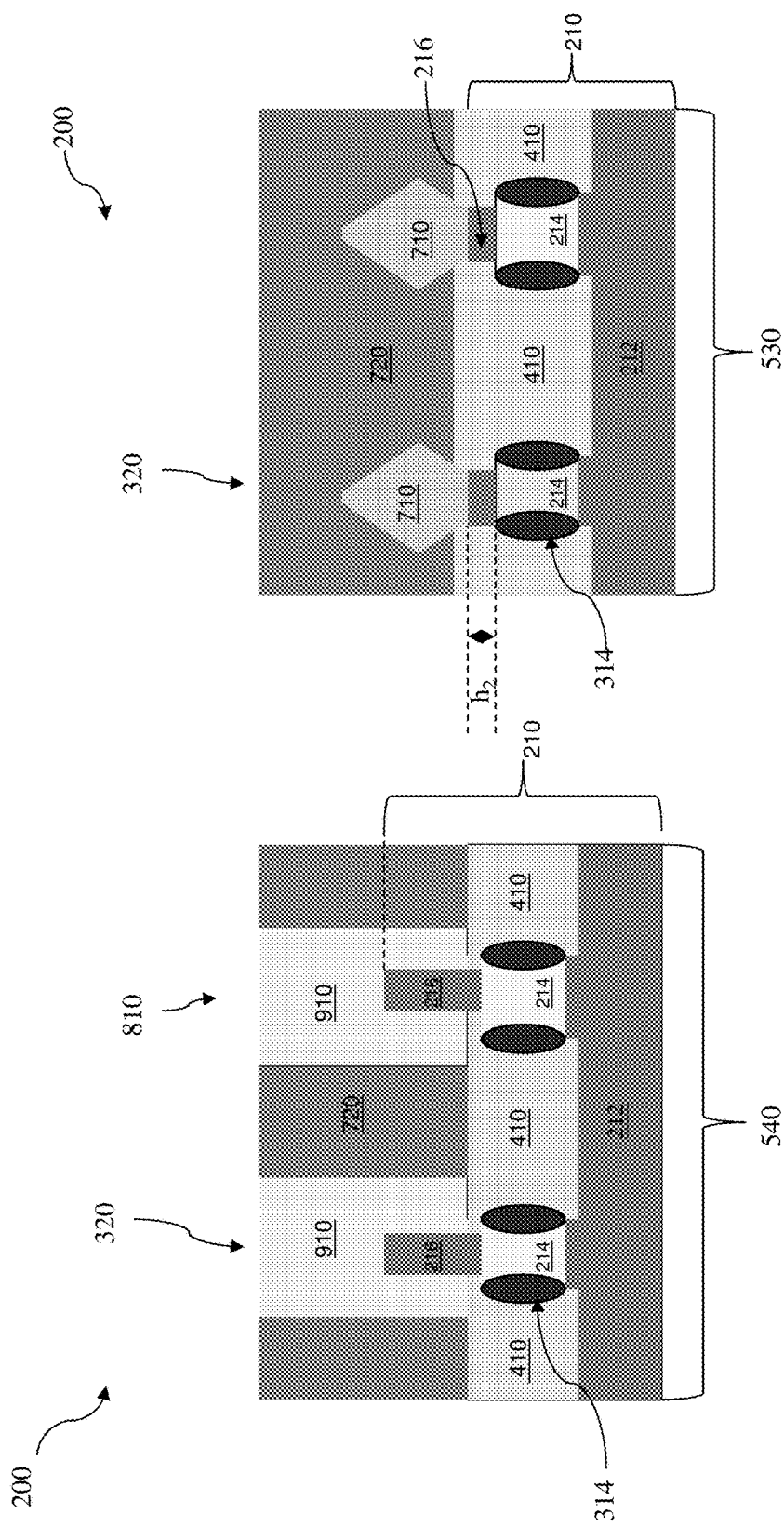

FINFET DEVICE WITH HIGH-K METAL GATE STACK

This application is related to patent applications U.S. Ser. No. 13/740,373 filed on Jan. 14, 2013, as "Semiconductor Device and Fabricating the Same;" U.S. Ser. No. 13/902,322 filed on May 24, 2013, as "FinFET Device and Method of Fabricating Same;" U.S. Ser. No. 13/934,992 filed on Jul. 3, 2013, as "Fin Structure of Semiconductor Device;" and U.S. Ser. No. 14/155,793 filed on Jan. 15, 2014, as "Semiconductor Device and Formation Thereof," the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIG. 1 is a flow chart of an example method for fabricating a semiconductor structure in accordance with some embodiments.

FIGS. 4 and 5 are cross-sectional views of an example semiconductor structure along the line A-A in FIG. 3A at fabrication stages constructed according to the method of FIG. 1.

FIG. 8A is a cross-sectional view of an example semiconductor structure along the line A-A in FIG. 7A at fabrication stages constructed according to the method of FIG. 1.

FIG. 8B is a cross-sectional view of an example semiconductor structure along the line AA-AA in FIG. 7A at fabrication stages constructed according to the method of FIG. 1.

FIG. 9B is a cross-sectional view of an example semiconductor structure along the line A-A in FIG. 9A at fabrication stages constructed according to the method of FIG. 1.

FIG. 9C is a cross-sectional view of an example semiconductor structure along the line AA-AA in FIG. 9A at fabrication stages constructed according to the method of FIG. 1.

FIG. 10B is a cross-sectional view of an example semiconductor structure along the line A-A in FIG. 10A at fabrication stages constructed according to the method of FIG. 1.

FIG. 10C is a cross-sectional view of an example semiconductor structure along the line AA-AA in FIG. 10A at fabrication stages constructed according to the method of FIG. 1.

DETAILED DESCRIPTION

Figure 2B:
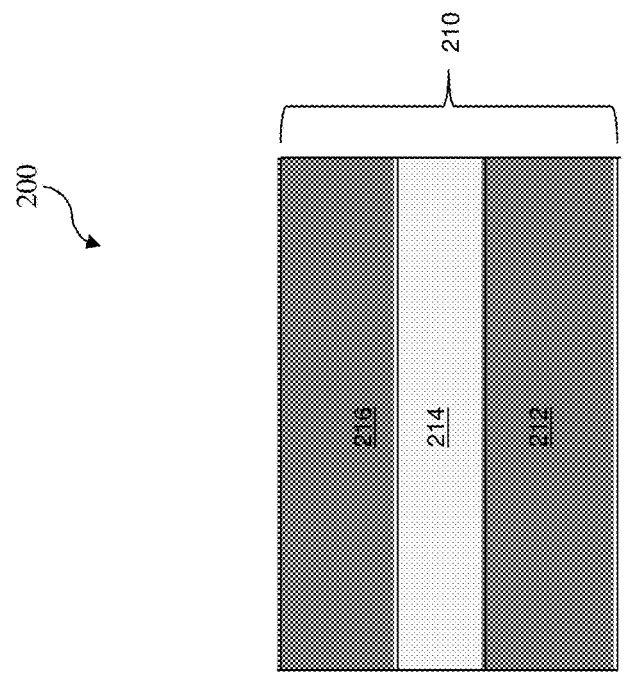
FIG. 2B is cross-sectional view of an example semiconductor structure along the line A-A in FIG. 2A at fabrication stages constructed according to the method of FIG. 1.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figures 6A, 6B:
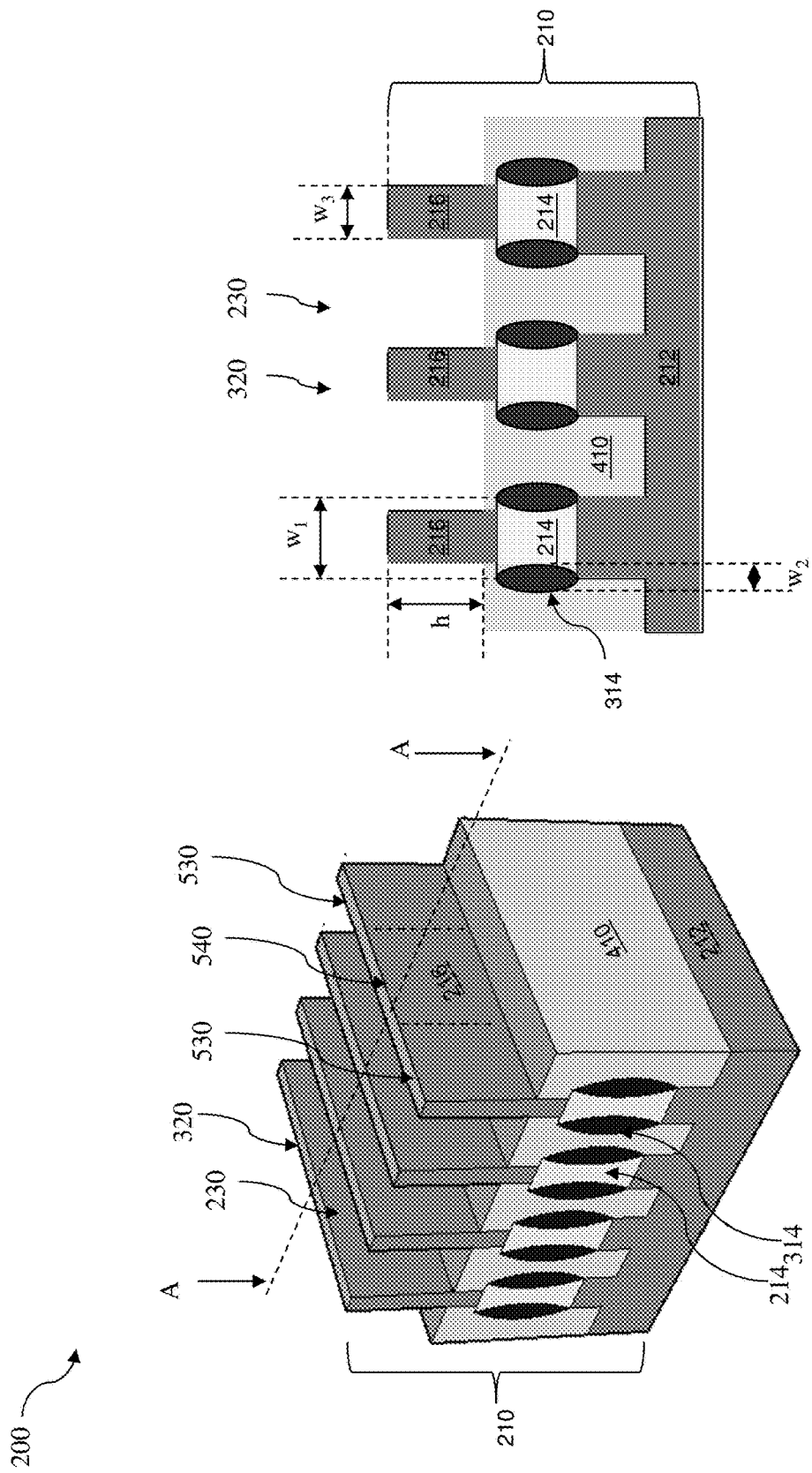
FIG. 6A is a diagrammatic perspective view of a semiconductor structure undergoing processes in accordance with some embodiments.
FIG. 6B is a cross-sectional view of an example semiconductor structure along the line A-A in FIG. 6A at fabrication stages constructed according to the method of FIG. 1.
Figure 7A:
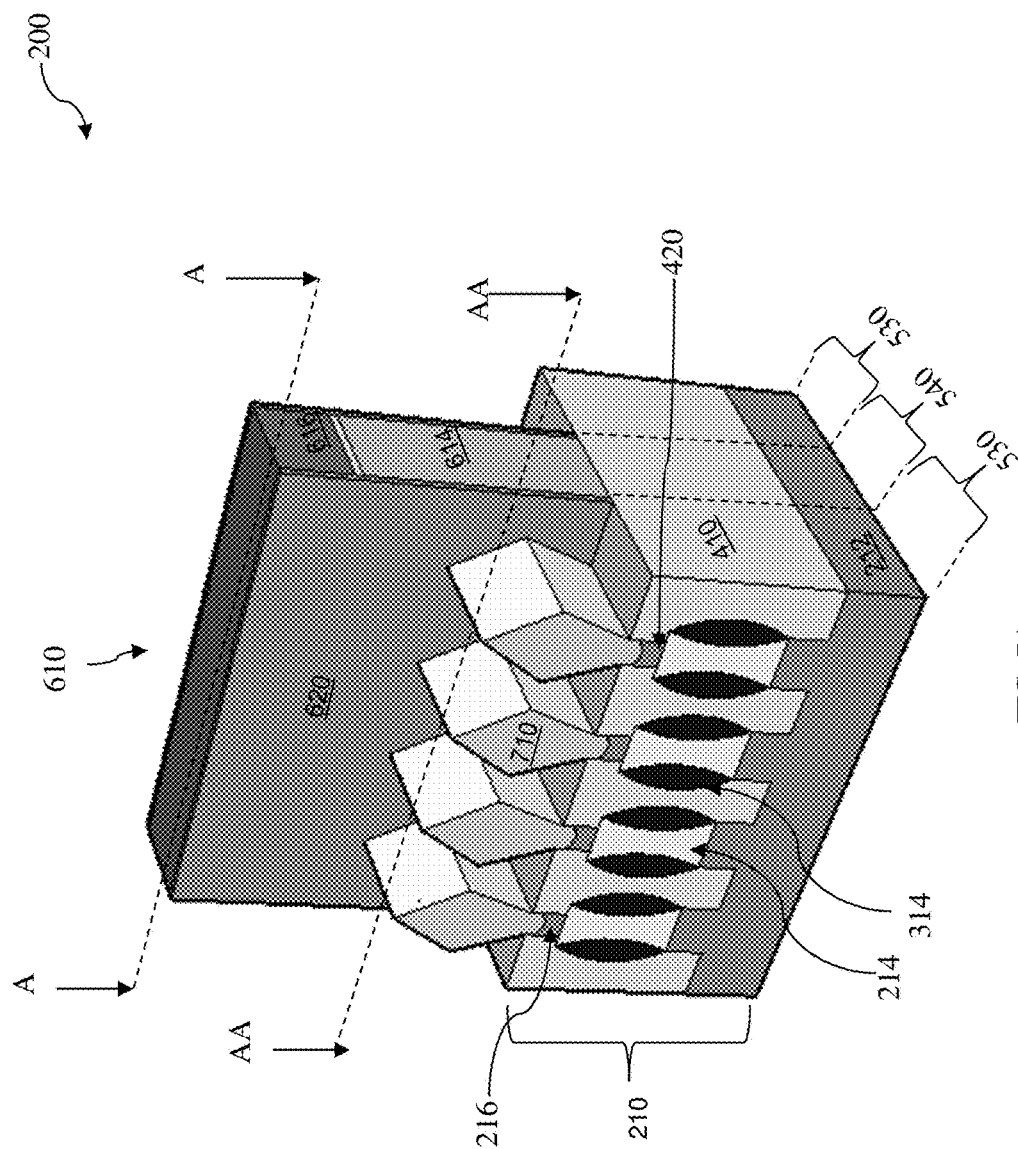
FIG. 7A is a diagrammatic perspective view of a semiconductor structure undergoing processes in accordance with some embodiments.
Figures 7B, 7C:
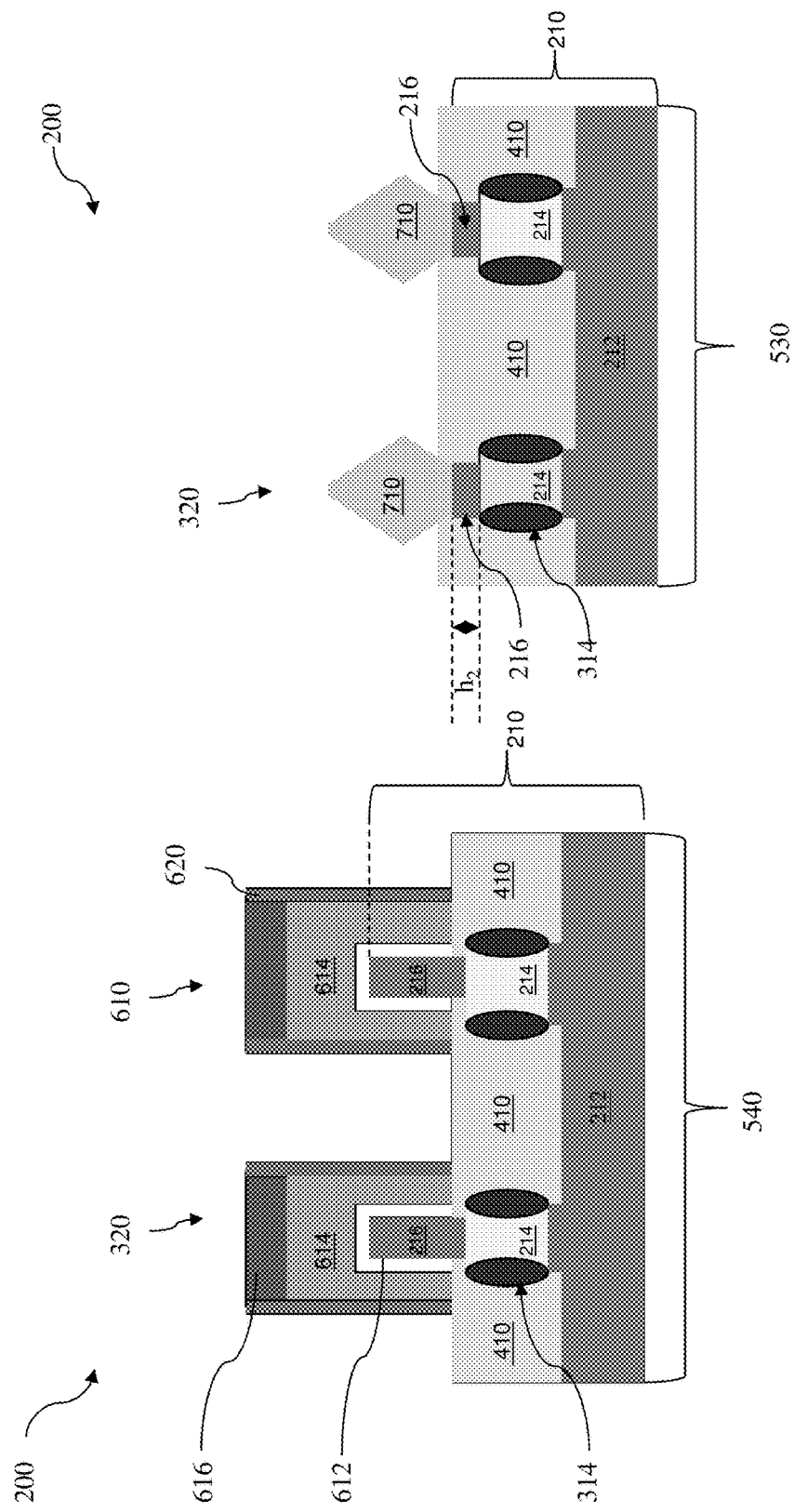
FIG. 7B is a cross-sectional view of an example semiconductor structure alone the line A-A in FIG. 7A at fabrication stages constructed according to the method of FIG. 1.
FIG. 7C is a cross-sectional view of an example semiconductor structure along a line AA-AA in FIG. 7A at fabrication stages constructed according to the method of FIG. 1.
Figure 9A:
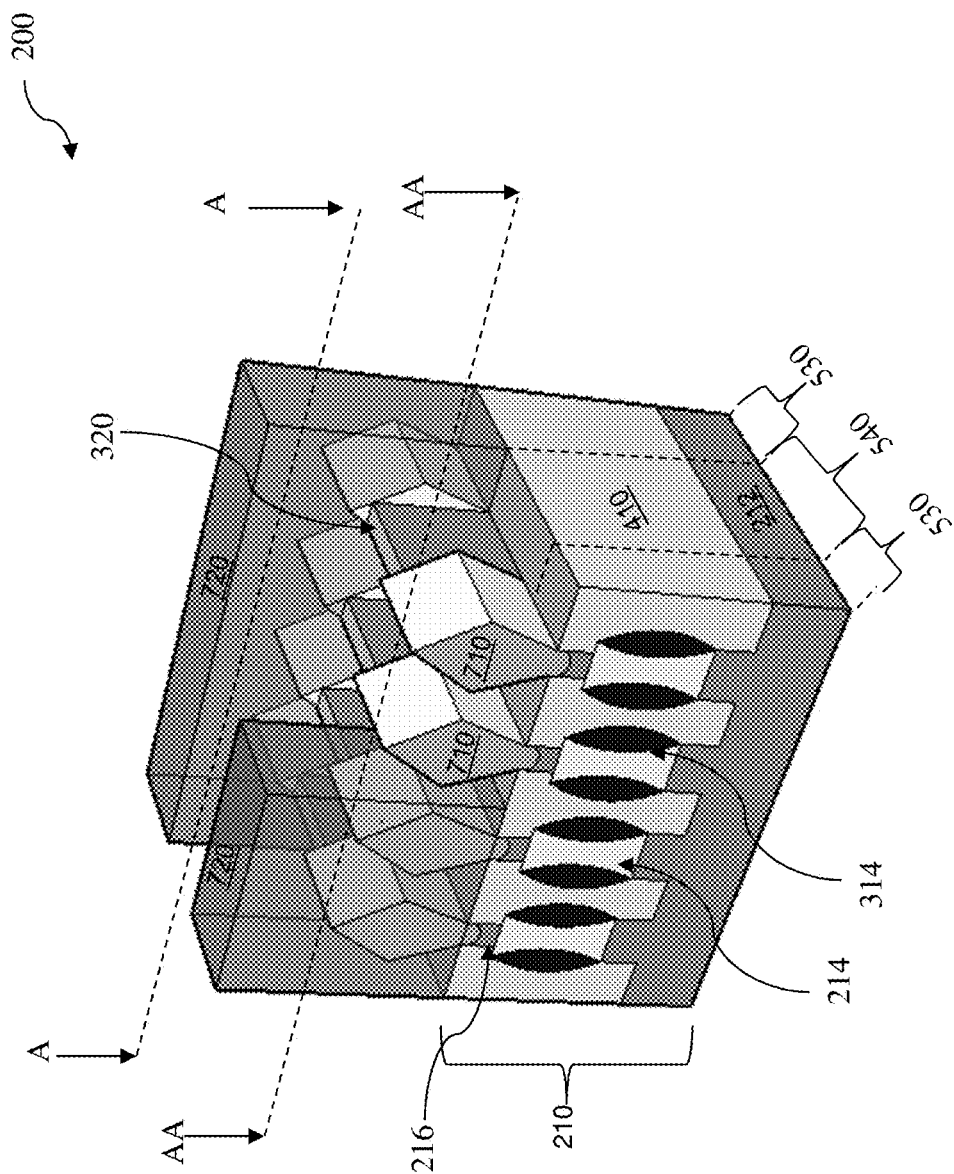
FIG. 9A is a diagrammatic perspective view of a semiconductor structure undergoing processes in accordance with some embodiments.
Figure 10A:
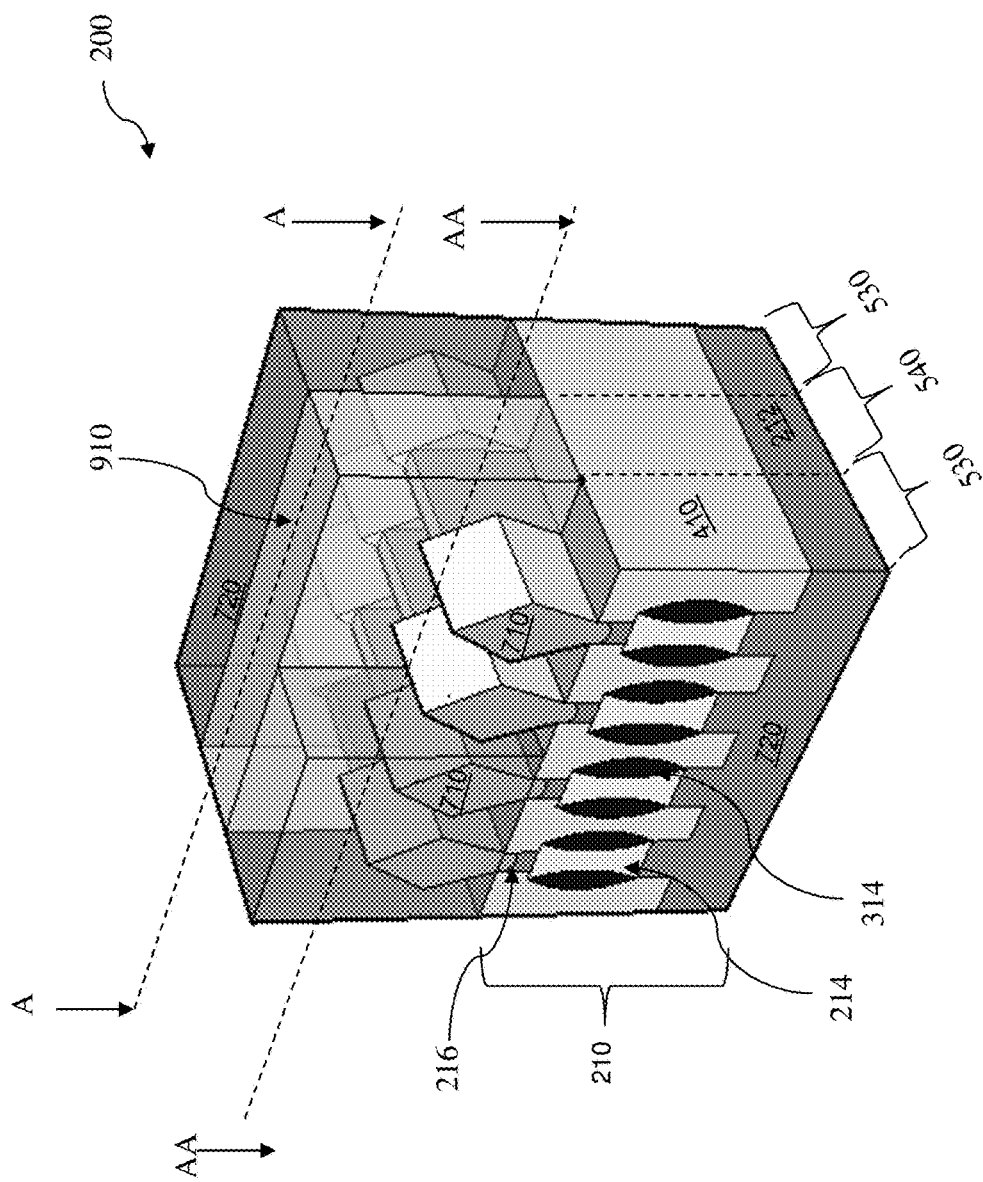
FIG. 10A is a diagrammatic perspective view of a semiconductor structure undergoing processes in accordance with some embodiments.
Figure 11:
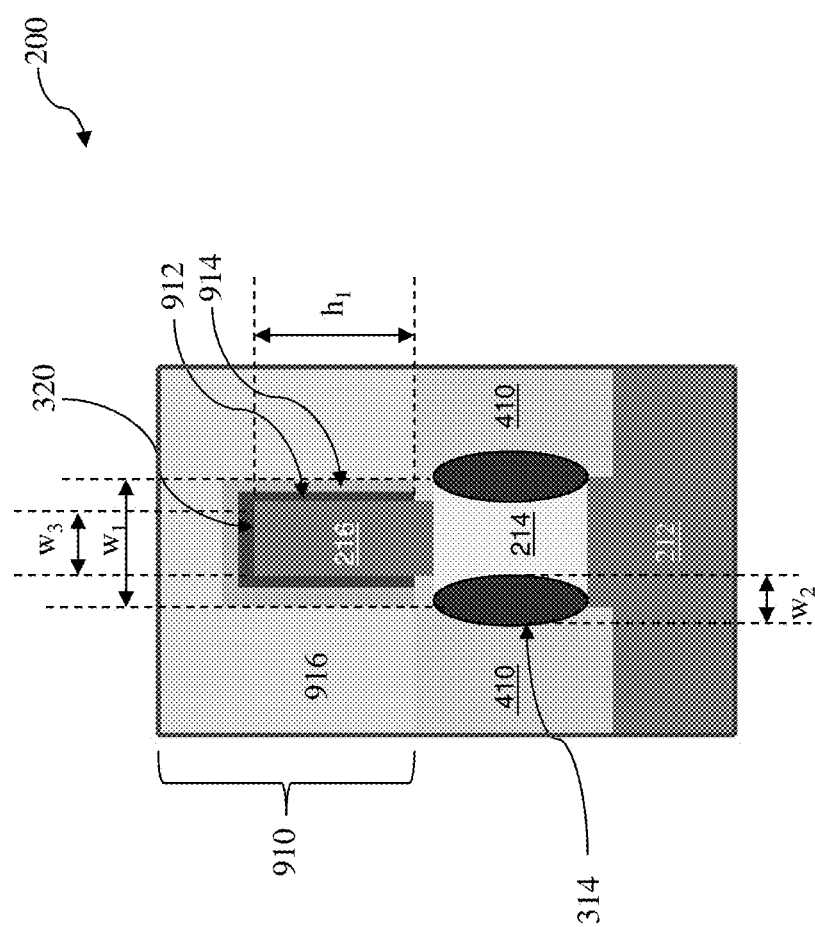
FIG. 11 is portions of the semiconductor structure of FIG. 10A in details.

FIG. 1 is a flowchart of a method 100 for fabricating a semiconductor structure 200 (particularly including a FinFET structure having one or more FinFET devices) in accordance with some embodiments. FIGS. 2A, 3A and 6A are side-perspective views of the semiconductor structure 200 manufactured according to the method 100. FIGS. 2B, 3B, 4, 5 and 6B are cross-section views of the semiconductor structure 200 along the line A-A of FIGS. 2A, 3A and 6A at fabrication stages constructed according to the method 100. FIG. 7A is a side-perspective view of the semiconductor structure 200 manufactured according to the method 100. FIGS. 7B and 8A are cross section views of the semiconductor structure 200 along the line A-A of FIG. 7A. FIGS. 7C and 8B are cross section views of the semiconductor structure 200 along the line AA-AA of FIG. 7A. FIGS. 9A and 10A are side-perspective views of the semiconductor structure 200 manufactured according to the method 100. FIGS. 9B and 10B are cross section views of the semiconductor structure 200 along the line A-A of FIGS. 9A and 10A. FIGS. 9C and 10C are cross section views of the semiconductor structure 200 along the line AA-AA of FIGS. 9A and 10A. FIG. 11 is portions of the semiconductor structure of FIG. 10A in details. It is understood that additional steps may be implemented before, during, and after the method, and some of the steps described may be replaced or eliminated for other embodiments of the method. The semiconductor structure 200 and the method 100 making the same are collectively described with reference to various figures.

Figure 2A:
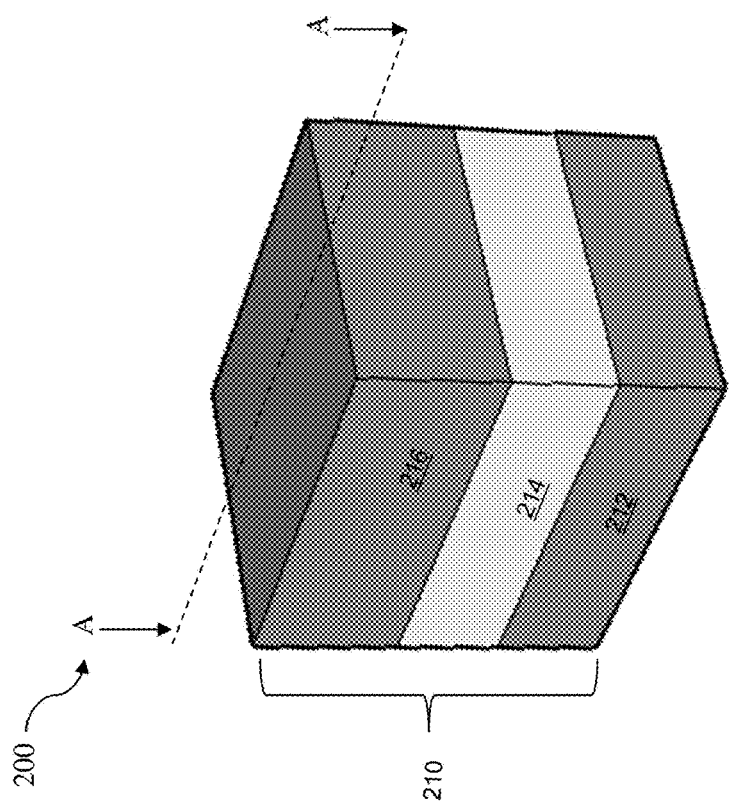
FIG. 2A is a diagrammatic perspective view of a semiconductor structure undergoing processes in accordance with some embodiments.

Referring to FIGS. 1 and 2A-2B, the method 100 begins at step 102 by providing a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

In the present embodiment, the substrate 210 includes a first semiconductor material layer 212, a second semiconductor material layer 214 disposed over the first semiconductor material layer 212 and a third semiconductor material layer 216 disposed over the second semiconductor material layer 214. The second and third semiconductor material layers, 214 and 216, are different from each other. The second semiconductor material layer 214 has a first lattice constant and the third semiconductor material layer 216 has a second lattice constant different from the first lattice constant. In the present embodiment, the second semiconductor material layer 214 includes silicon germanium (SiGe), and both of the first and the third semiconductor material layers, 212 and 216, include silicon. In various examples, the first, the second and the third semiconductor material layers, 212, 214 and 216, may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the second and the third semiconductor material layers, 214 and 216, are deposited by epitaxial growth, referred to as a blanket channel epi. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

The substrate 210 may include various doped features depending on design requirements as known in the art. The doped features may be doped with p-type dopants, such as boron; n-type dopants, such as phosphorus or arsenic; or combinations thereof. The doped features may be formed by ion implantations and may include well structures, such as a P-type well, an N-type well, or both.

Figure 3B:
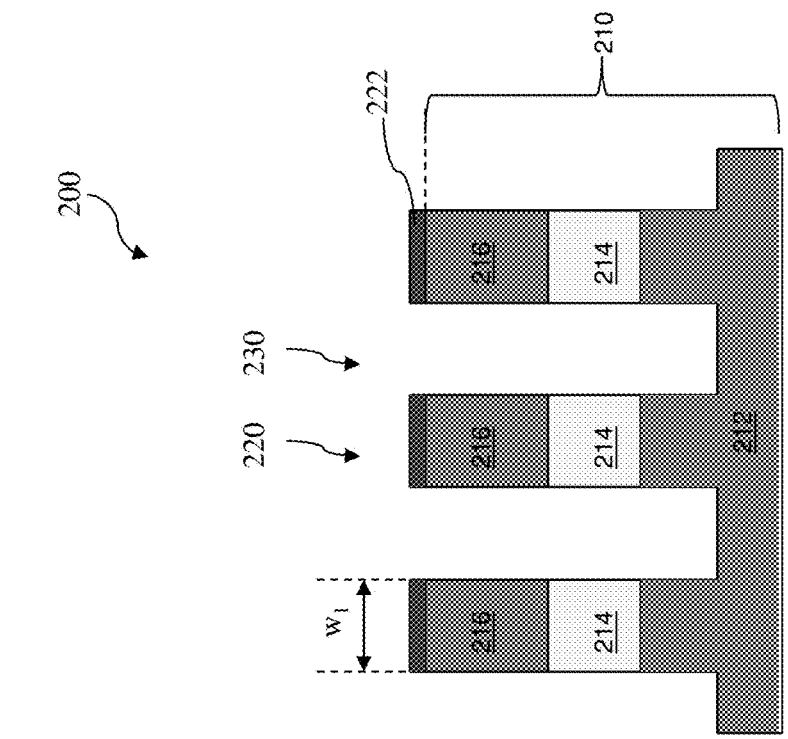
FIG. 3B is a cross-sectional view of an example semiconductor structure along the line A-A in FIG. 3A at fabrication stages constructed according to the method of FIG. 1.
Figure 3A:
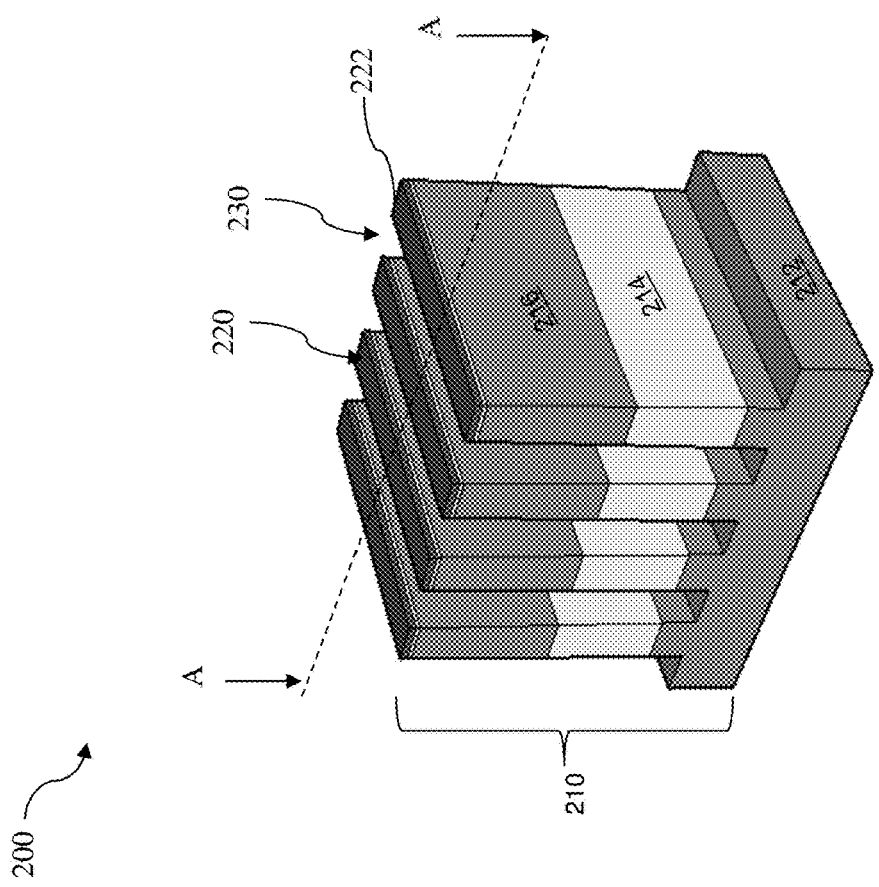
FIG. 3A is a diagrammatic perspective view of a semiconductor structure undergoing processes in accordance with some embodiments.

Referring to FIGS. 1 and 3A-3B, the method 100 proceeds to step 104 by forming first fins 220 and trenches 230 in the substrate 210. The first fin 220 has a first width $w_1$. In one embodiment, a patterned hard mask layer 222 is formed over the substrate 210. The patterned hard mask layer 222 includes silicon oxide, silicon nitride, silicon oxynitride, or any other suitable dielectric material. The patterned hard mask layer 212 may include a single material layer or multiple material layers. The patterned hard mask layer 222 may be formed by depositing a material layer by thermal oxidation, chemical vapor deposition (CVD), atomic layer deposition (ALD), or any other appropriate method, forming a patterned photoresist (resist) layer by a lithography process, and etching the material layer through the openings of the patterned photoresist layer to form the patterned hard mask layer 222.

An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing.

The substrate 210 is then etched through the patterned hard mask layer 222 to form the first fins 220 and the trenches 230 in the substrate 210. In another embodiment, the patterned photoresist layer is directly used the patterned mask layer 222 as an etch mask of the etch process to form the first fins 220 and the trenches 230 in the substrate 210. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, the etching depth is controlled such that the third and the second semiconductor material layers, 214 and 216 are exposed but the first semiconductor material layer 212 is partially exposed in the trench 230. Thus the first fin 220 is formed as a stack of layers, 216, 214 and 212 (in an order from top to bottom).

Figure 4:
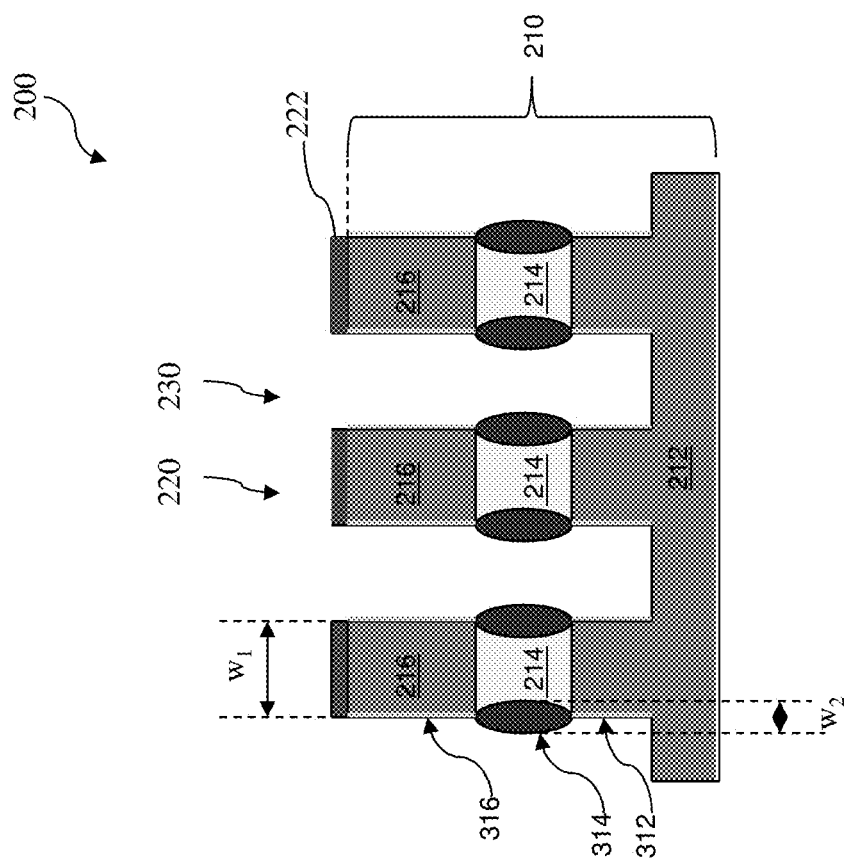

Referring to FIGS. 1 and 4, the method 100 proceeds to step 106 by performing a thermal oxidation process to the semiconductor structure 200. In one embodiment, the thermal oxidation process is conducted in oxygen ambient. In another embodiment, the thermal oxidation process is conducted in a combination of steam ambient and oxygen ambient. During the thermal oxidation process, at least outer layers of the first, the second and the third semiconductor material layers, 212, 214 and 216, in the trench 230 convert to a first, a second and a third semiconductor oxide features 312, 314 and 316, respectively. In the present embodiment, the thermal oxidation process is controlled such that the second semiconductor material layer 214 oxidizes much faster than the first and third semiconductor material layers, 212 and 216. In another words, comparing to the second semiconductor oxide feature 314, the first and third semiconductor oxide features, 312 and 316, are quite thin. As an example, the thermal oxidation process to the semiconductor structure 200 is performed in a $H_2O$ reaction gas with a temperature ranging from about 400° C. to about 600° C. and under a pressure ranging from about 1 atm. to about 20 atm. After the oxidation process, a cleaning process is performed to remove the first and the third semiconductor oxide features, 312 and 316. The cleaning process may be performed using diluted hydrofluoric (DHF) acid.

In the present example, the second semiconductor oxide features 314 extends in the vertical direction with a horizontal dimension varying from the top surface to the bottom surface of the second semiconductor material layer 214. In furtherance of the present example, the horizontal dimension of the second semiconductor oxide features 314 reaches its maximum, referred to as a second width $w_2$, and decreases to close to zero when approaches to the top and bottom surfaces of the second semiconductor oxide features 314. By tuning of the thermal oxidation process, selecting a composition and thickness of the second semiconductor material layer 214 and tuning the oxidation temperature, it achieves a target second width $w_2$ of the second semiconductor oxide feature 314 to apply an adequate stress to the third semiconductor material layer 216 in the first fin 220, where a gate channel is to be defined underlying a gate region, which will be described later.

In one embodiment, the second semiconductor material layer 214 includes silicon germanium ($SiGe_{x_1}$) and both of the first and the third semiconductor material layers, 212 and 216, include silicon (Si). The subscript $x_1$ is a first Ge composition in atomic percent and it may be adjusted to meet a predetermined volume expansion target. In one embodiment, $x_1$ is selected in a range from about 20% to about 80%. An outer layer of the $SiGe_{x_1}$ layer 214 is oxidized by the thermal oxidation process, thereby forming the silicon germanium oxide ($SiGeO_y$) feature 314, where subscript y is oxygen composition in atomic percent. The second width $w_2$ of the $SiGeO_y$ feature 314 is achieved in a range of about 10% - about 30% of the first width $w_1$ to apply an adequate stress to the third semiconductor material layer 216 in the first fin 220. A center portion of the $SiGe_{x_1}$ layer 214 changes to a second Ge composition $x_2$, which is much higher than $x_1$. A size and shape of the center portion of $SiGe_{x_2}$ layer 214 vary with process conditions, such as thermal oxidation temperature and time. Also the second Ge composition $x_2$ in the center portion is higher than other portions, such as a top portion, a bottom portion, a left side portion and a right side portion. As an example, the composition $x_2$ of Ge in the center portion is about 5% to about 30% higher than other portions.

Referring to FIGS. 1 and 5, the method 100 proceeds to step 108 by trimming the third semiconductor material layer 216 to a smaller width, a third width $w_3$. In the present embodiment, the third width $w_3$ is substantially smaller than the first width $w_1$. With an adequate difference between the third width $w_3$ and the first width $w_1$, it will enhance a stress applying to the third semiconductor material layer 216 in the first fin 220, where a transistor channel is to be defined underlying a gate region, which will be described later. As an example, the third width $w_3$ is less than about 75% of the first width $w_1$. In one embodiment, the hard mask layer 222 and the third semiconductor oxide layer 316 is removed from the first fin 220 first and then the third semiconductor material layer 216 is trimmed. The third semiconductor material layer 216 may be selectively trimmed by a wet etch, a dry etch, or a combination thereof. In one embodiment, the wet etching solution includes a tetramethylammonium hydroxide (TMAH), a HF/HNO3/CH3COOH solution, or other suitable solution. After trimming the third semiconductor material layer 216 to the third width $w_3$, the first fin 220 converts to a second fin 320. The second fin 320 has the third semiconductor material layer 216 as its upper portion and the second semiconductor material layer 214, having a second semiconductor oxide layer 314 as its outlier, as its lower portion. In one embodiment, the second fin 320 has Si layer 216 as the upper portion and SiGe 214, having the SiGeO as its outer layer, as its lower portion.

Referring to FIGS. 1 and 6A-6B, the method 100 proceeds to step 110 by forming one or more isolation features 410 on the substrate 210, including in the trench 230. In the present embodiment, the isolation features 410 are shallow trench isolation (STI) features. The isolation features 410 may include silicon oxide, silicon nitride, silicon oxynitride, other suitable materials, or combinations thereof. The STI features 410 are formed by any suitable procedure including deposition, photolithography, and/or etching processes. In one embodiment, the STI features 410 are formed by filling in the trenches 230 with one or more dielectric material (such as silicon oxide), performing a chemical mechanical polishing (CMP) process to remove excessive dielectric material and planarize the top surface and followed by selectively recessing the dielectric material to expose a portion of the upper portion of the second fin 320, a portion the third semiconductor material layer 216. The recessing process is controlled such that the third semiconductor material layer 216 is exposed with a first height $h_1$, which is selected to be adequate for a transistor channel to be defined underlying a gate region, which will be described later. In one embodiment, the first height $h_1$ is in a range of 50%-90% of a whole thickness of the third semiconductor material layer 216. As an example, the first height $h_1$ is in a range of 20 nm-40 nm.

In some embodiments, the second 320 include source/drain regions 530 and a gate region 540. In furtherance of the embodiment, one of the source/drain regions 530 is a source region, and another of the source/drain regions 530 is a drain region. The source/drain regions 530 are separated by the gate region 540. Therefore, during previous steps (step 106 and step 108), a proper strain is induced to the second fin 320, including the gate region 540 and it will enhance mobility in a channel region in the gate region 540 of the semiconductor structure 200.

Referring to FIGS. 1 and 7A-7C, the method 100 proceeds to step 112 by forming a gate stack 610 and sidewall spacers 620 on sidewalls of the gate stack 610, in the gate region 540. In one embodiment using a gate-last process, the gate stack 610 is a dummy gate and will be replaced by the final gate stack at a subsequent stage. Particularly, the dummy gate stack 610 is to be replaced later by a high-k dielectric layer (HK) and metal gate electrode (MG) after high thermal temperature processes, such as thermal annealing for source/drain activation during the sources/drains formation. The dummy gate stack 610 is formed on the substrate 210 and is partially disposed over the gate region 540 in the second fin 320. In one embodiment, the dummy gate stack 610 includes a dielectric layer 612, an electrode layer 614 and a gate hard mask 616. The dummy gate stack 610 is formed by a suitable procedure including deposition and patterning. The patterning process further includes lithography and etching. In various examples, the deposition includes CVD, physical vapor deposition (PVD), ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The dielectric layer 612 includes silicon oxide. Alternatively or additionally, the dielectric layer 612 may include silicon nitride, a high-k dielectric material or other suitable material. The electrode layer 614 may include polycrystalline silicon (polysilicon). The third hard mask 616 includes a suitable dielectric material, such as silicon nitride, silicon oxynitride or silicon carbide.

The sidewall spacers 620 may include a dielectric material such as silicon oxide, silicon nitride, silicon carbide, silicon oxynitride, or combinations thereof. The sidewall spacers 620 may include a multiple layers. Typical formation methods for the sidewall spacers 620 include depositing a dielectric material over the gate stack 610 and then anisotropically etching back the dielectric material. The etching back process may include a multiple-step etching to gain etch selectivity, flexibility and desired overetch control.

Referring again to FIGS. 1 and 7A-7C, the method 100 proceeds to step 114 by forming source/drain features 710 in the source/drain regions 530. The source/drain features 710 may be formed by recessing a portion of the upper portion of the second fin 320, in the source/drain regions 530. In present embodiment, the recessing process is controlled to leave the remaining third semiconductor material layer 216 have a second height $h_2$ for gaining process integration flexibility. The third semiconductor material layer 216 is recessed to form source/drain recessing trenches and epitaxially growing a fourth semiconductor material layer in the sources/drains recessing trenches. The fourth semiconductor material layer includes Ge, Si, GaAs, AlGaAs, SiGe, GaAsP, or other suitable material. The source/drain features 710 may be formed by one or more epitaxy or epitaxial (epi) processes. The source/drain features 710 may be in-situ doped during the epi process. For example, the epitaxially grown SiGe source/drain features 710 may be doped with boron; and the epitaxially grown Si source/drain features 710 may be doped with carbon to form Si:C source/drain features, phosphorous to form Si:P source/drain features, or both carbon and phosphorous to form SiCP source/drain features. In one embodiment, the source/drain features 710 are not in-situ doped, an implantation process (i.e., a junction implant process) is performed to dope the source/drain features 710.

The steps 112 and 114 may be implemented collectively in one procedure to form dummy gate stacks 610 and the source/drain features 710. One embodiment of the procedure is described below. The dummy gate stacks 610 are first formed by deposition and patterning. For example, the dielectric layer 612 includes silicon oxide and is formed by a suitable technique, such as in-situ steam growth (ISSG). The electrode layer 614 includes polysilicon and is deposited by a suitable technique, such as CVD. A hard mask layer 616 includes a suitable dielectric material (such as silicon nitride) and is deposited by a suitable technique, such as CVD. Then the hard mask layer 616 is patterned by a lithography process and an etch process, thereby forming various openings in the hard mask layer, exposing the underlying dummy gate materials within the openings. Another etch process is applied to the dummy gate materials through the openings of the hard mask layer using the hard mask as an etch mask, thereby forming the gate stacks 610. Thereafter, an etch process is applied to recess a portion of the second fin 420, in the source/drain regions 530 to form source/drain recessing trenches and epitaxially growing a fourth semiconductor material layer in the sources/drains recessing trenches. A first ion implantation process with a first doping dose is applied to the semiconductor structure 200, thereby forming light doped drain (LDD) features. Alternatively, LDD features are formed by in-situ doping. Spacers 620 are formed thereafter by deposition and anisotropic etch. Afterward, a second ion implantation process with a second doping dose greater than the first doping dose is applied to the semiconductor structure 200, thereby forming heavily doped source and drain features that are offset from the LDD features by the spacers 620. The LDD features and heavily doped source and drain features collectively constitute the source and drain features 710.

Referring to FIGS. 1 and 8A-8B, the method 100 proceeds to step 116 by forming an interlayer dielectric (ILD) layer 720 on the substrate 210 between the gaps of the dummy gate stacks 610. The ILD layer 720 includes silicon oxide, silicon oxynitride, low k dielectric material or other suitable dielectric materials. The ILD layer 720 may include a single layer or alternative multiple layers. The ILD layer 720 is formed by a suitable technique, such as CVD, ALD and spin-on (SOG). A chemical mechanical polishing (CMP) process may be performed thereafter to remove excessive ILD layer 720 and planarize the top surface of the semiconductor structure 200.

Referring to FIGS. 1 and 9A-9C, the method 100 proceeds to step 118 by removing the dummy gate stacks 610 to form one or more gate trench 810. The upper portion of the second fin 320 and the isolation features 410 in the gate trench 810 remain. The dummy gate stacks 610 are removed by an etch process (such as selective wet etch or selective dry etch) designed to have an adequate etch selectivity with respect to the third semiconductor material layer 216. The etch process may include one or more etch steps with respective etchants. The gate hard mask layer 616 and the spacers 620 are removed as well. Alternatively, the dummy gate stack 610 may be removed by a series of processes including photolithography patterning and etching process.

Referring to FIGS. 1 and 10A-10C, the method 100 proceeds to step 120 by forming metal gate stacks (MG) 910 over the substrate 210, including wrapping over a portion of the second fins 320 in the gate region 540. The metal gate stacks 910 include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the metal gate stacks 910 includes depositions to form various gate materials and a CMP process to remove the excessive gate materials and planarize the top surface of the semiconductor structure 200.

The semiconductor structure 200 is further illustrated in FIG. 11, in a sectional fragmental view. Particularly, a portion of the semiconductor structure 200 is zoomed in for clarity. In one embodiment, the gate dielectric layer includes an interfacial layer (IL) 912 is deposited by a suitable method, such as atomic layer deposition (ALD), CVD, thermal oxidation or ozone oxidation. The IL 912 includes oxide, HfSiO and oxynitride. A HK dielectric layer 914 is deposited on the IL 912 by a suitable technique, such as ALD, CVD, metal-organic CVD (MOCVD), physical vapor deposition (PVD), other suitable technique, or a combination thereof. The HK dielectric layer 914 may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

The gate dielectric layers, 912 and 914, wrap over the upper portion of the second fins 320 in the gate region 540, where a gate channel will be formed during operating the semiconductor structure 200. Therefore the strain induced by the lower portion of the second fin 320, with the outer layer of the second semiconductor oxide layer 314, and enhanced by the width difference between the first width $w_1$ and the third width $w_3$, increases mobility in the channel region.

A metal gate (MG) electrode 916 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 916 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 916 may be formed by ALD, PVD, CVD, or other suitable process. The MG electrode 916 may be formed separately for the N-FET and P-FFET with different metal layers. A CMP process may be performed to remove excessive MG electrode 916.

The semiconductor structure 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the method 100, and some operations described above may be replaced or eliminated for other embodiments of the method.

Based on the above, the present disclosure offers a semiconductor device with a strain gate channel using techniques of volume expansion and trimming an upper portion to induce an efficient strain to the gate channel to improve device performance.

Thus, the present disclosure provides one embodiment of a semiconductor structure. The semiconductor structure includes a substrate, a first fin structure over the substrate. The first fin structure includes a first semiconductor material layer, having a semiconductor oxide layer as its outer layer, as a lower portion of the first fin structure. The first semiconductor has a first width and the semiconductor oxide layer has a second width. The first fin structure also includes a second semiconductor material layer as an upper portion of the first fin structure. The second semiconductor material layer has a third width, which is substantially smaller than the first width. The semiconductor structure also includes a gate region formed over a portion of the first fin and a high-k (HK)/metal gate (MG) stack on the substrate including wrapping over a portion of the first fin structure in the gate region.

The present disclosure also provides another embodiment of a semiconductor structure. The semiconductor structure includes a substrate, a gate region in the substrate, source and drain (S/D) regions separated by the gate region. The semiconductor structure also includes a first fin structure in a gate region. The first fin structure includes a silicon germanium (SiGex) layer as a lower portion, having a silicon germanium oxide (SiGeOy) layer as its outer layer, where x is Ge composition in atomic percent and y is oxygen composition in atomic percent. The SiGex layer has a first width and the SiGeOy has a second width. The first fin also includes a Si layer as an upper portion, wherein the Si layer has a third width, which is smaller than the first width. The semiconductor structure also includes a second fin structure in S/D regions. The second fin structure include a silicon germanium (SiGex) layer as a lower portion, having a silicon germanium oxide (SiGeOy) layer as its outer layer and the Si layer as an upper portion. The semiconductor structure also includes source/drain features on top of the upper portion of the second fin structure in the source and drain regions and a high-k/metal gate (HKMG) over the substrate including wrapping over a portion of the first fin structure.

The present disclosure also includes an embodiment of a method fabricating a semiconductor structure. The method includes providing a substrate, epitaxially growing a first semiconductor material layer over the substrate and epitaxially growing a second semiconductor material layer on top of the first semiconductor material layer. The method also includes etching the second and the first semiconductor material layers to form a first fin and a trench in the substrate. The first fin has a first width. The method also includes applying a thermal oxidation process to second semiconductor material layers of the first fin in the trench to convert an outer portion of the exposed first semiconductor to a semiconductor oxide. The semiconductor has a second width. The method also includes trimming the second semiconductor material layer in the first fin to a third width to form a second fin. The second fin has a gate region, source and drain regions separated by the gate region. The method also includes forming an isolation feature in the trench, forming a dummy gate stack over the substrate, including wrapping over the second fin in the gate region, recessing a portion of the second semiconductor material layer in the source and drain region of the second fins, epitaxially growing a third semiconductor material on the recessed second fins to form a source/drain feature, removing the dummy gate stack to form a gate trench and forming a high-k/metal gate (HK/MG) stack in the gate trench, including wrapping over a portion of the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
  a substrate having a gate region and source/drain (S/D) regions separated by the gate region;
  a first fin structure over the substrate and in the gate region, the first fin structure including a lower portion and an upper portion over the lower portion, wherein:
    the lower portion includes a portion of a first semiconductor material layer as its inner layer and a portion of a semiconductor oxide layer as its outer layer, wherein the first semiconductor material layer has a first width and the semiconductor oxide layer has a second width, the first semiconductor material layer and the semiconductor oxide layer have a same thickness, the semiconductor oxide layer is wider in its center portion than its top and bottom portions, and the semiconductor oxide layer includes oxygen and material of the first semiconductor material layer; and
    the upper portion includes a portion of a second semiconductor material layer, wherein the second semiconductor material layer has a third width, which is smaller than the first width;
  a high-k (HK)/metal gate (MG) stack on the substrate and wrapping around a portion of the first fin structure in the gate region;
  epitaxial S/D layers in the S/D regions, wherein the semiconductor oxide layer extends under the epitaxial S/D layers for a full length of the epitaxial S/D layers; and
  a second fin structure in the S/D regions and under the epitaxial S/D layers, the second fin structure including a second lower portion and a second upper portion over the second lower portion, wherein:
    the second lower portion of the second fin structure includes another portion of the first semiconductor material layer as its inner layer and another portion of the semiconductor oxide layer as its outer layer;
    the second upper portion of the second fin structure includes another portion of the second semiconductor material layer and the second upper portion of the second fin structure is between the second lower portion of the second fin structure and a bottom surface of the epitaxial S/D layers.

2. The device of claim 1, wherein the second width is in a range of 10% to 30% of the first width.

3. The device of claim 1, wherein the third width is less than 75% of the first width.

4. The device of claim 1, wherein the portion of the first fin structure wrapped around by the HK/MG has a height in a range of 20 nm to 40 nm.

5. The device of claim 1, wherein the first semiconductor material layer includes silicon germanium (SiGex), where x is Ge composition in atomic percent.

6. The device of claim 5, wherein a center portion of the first semiconductor material layer has a higher Ge composition x than other portions of the first semiconductor material layer.

7. The device of claim 6, wherein the Ge composition of the center portion is 5% to 30% higher than the other portions.

8. The device of claim 1, wherein the semiconductor oxide layer includes SiGeOy, where y is oxygen composition in atomic percent.

9. The device of claim 1,
  wherein the epitaxial S/D features are directly above at least a portion of the semiconductor oxide layer.

10. The device of claim 1, further comprising:
  an isolation layer, wherein an upper surface of the isolation layer is below an uppermost surface of the upper portion of the first fin structure and above a lowermost surface of the upper portion of the first fin structure.

11. A device, comprising:
  a substrate having a gate region and source and drain (S/D) regions separated by the gate region;
  a first fin structure in the gate region, the first fin structure including a lower portion and an upper portion over the lower portion, wherein:
    the lower portion of the first fin structure includes a portion of a silicon germanium (SiGex) layer as its inner layer and a portion of a silicon germanium oxide (SiGeOy) layer as its outer layer, where x is Ge composition in atomic percent and y is oxygen composition in atomic percent, wherein the SiGex layer has a first width and the SiGeOy layer has a second width, the SiGex layer and the SiGeOy layer have a same thickness; and
    the upper portion of the first fin structure includes a portion of a Si layer, wherein the Si layer has a third width, which is smaller than the first width;
  a second fin structure in the S/D regions, the second fin structure including a second lower portion and a second upper portion over the second lower portion, wherein:
    the second lower portion of the second fin structure includes another portion of the silicon germanium (SiGex) layer as its inner layer and another portion of the silicon germanium oxide (SiGeOy) layer as its outer layer; and
    the second upper portion of the second fin structure includes another portion of the Si layer;
  epitaxial source/drain layers over the second upper portion of the second fin structure in the S/D regions and directly above at least a portion of the SiGeOy layer, wherein a bottom surface of the epitaxial source/drain layers is above the second upper portion of the second fin structure; and
  a high-k/metal gate (HK/MG) over the substrate and wrapping around a portion of the first fin structure in the gate region.

12. The device of claim 11, wherein the second width is in a range of 10% to 30% of the first width.

13. The device of claim 11, wherein the third width is less than 75% of the first width.

14. The device of claim 11, wherein a center portion of the SiGex layer has a higher Ge composition x than other portions of the SiGex layer.

15. The device of claim 14, wherein the Ge composition x of the center portion of the SiGex layer is 5% to 30% higher than the other portions of the SiGex layer.

16. The device of claim 11, further comprising:
an isolation layer, wherein a top surface of the isolation layer is above a top surface of the lower portion of the first fin structure, and below a top surface of the upper portion of the first fin structure, and wherein the top surface of the isolation layer is above both a top surface of the second lower portion of the second fin structure and a top surface of the second upper portion of the second fin structure.

17. The device of claim 11, wherein the silicon germanium oxide layer is wider in its center portion than its top and bottom portions.

18. A semiconductor device, comprising:
a substrate;
a first fin structure over the substrate, the first fin structure including a lower portion and an upper portion over the lower portion, wherein:
the lower portion includes a portion of a first semiconductor material layer as its inner layer and a portion of a semiconductor oxide layer as its outer layer, wherein the first semiconductor material layer has a first width and the semiconductor oxide layer has a second width that is less than the first width, the first semiconductor material layer and the semiconductor oxide layer have a same thickness, the semiconductor oxide layer is wider in its center portion than its top and bottom portions, and the semiconductor oxide layer includes oxygen and material of the first semiconductor material layer; and
the upper portion includes a portion of a second semiconductor material layer, wherein the second semiconductor material layer has a third width that is less than the first width;
a high-k (HK)/metal gate (MG) stack over the substrate and wrapping around a portion of the first fin structure; and
two epitaxial source/drain layers on two opposing sides of the HK MG stack and directly above at least a portion of the first semiconductor material layer, wherein the semiconductor oxide layer extends a full length of the at least the portion of the first semiconductor material layer, wherein an entirety of the two epitaxial source/drain layers is above the second semiconductor material layer.

19. The semiconductor device of claim 18, wherein the second width is in a range of 10% to 30% of the first width and the third width is less than 75% of the first width.

20. The semiconductor device of claim 18, wherein the first semiconductor material layer includes silicon germanium (SiGex), where x is Ge composition in atomic percent, and wherein a center portion of the first semiconductor material layer has a higher Ge composition x than other portions of the first semiconductor material layer.

* * * * *